United States Patent [19]

Rixon

[11] Patent Number: 5,243,304
[45] Date of Patent: Sep. 7, 1993

[54] VESTIGIAL SIDEBAND MODULATOR FOR A BASEBAND INPUT SIGNAL

[75] Inventor: Alan R. Rixon, Galleywood, United Kingdom

[73] Assignee: GEC - Marconi Limited, Stanmore, United Kingdom

[21] Appl. No.: 864,877

[22] Filed: Apr. 7, 1992

[30] Foreign Application Priority Data

Apr. 11, 1991 [GB] United Kingdom ............... 9107652

[51] Int. Cl.$^5$ .............................................. H03C 1/00
[52] U.S. Cl. .................... 332/170; 332/151; 375/61; 455/102; 455/109
[58] Field of Search ............. 332/170, 171, 149, 151, 332/117, 120; 375/61, 39, 43, 50; 455/47, 102, 109, 110

[56] References Cited

U.S. PATENT DOCUMENTS

3,259,692  7/1966  Aspinwall ...................... 332/170 X
4,994,769  2/1991  Kishi ................................ 332/170

FOREIGN PATENT DOCUMENTS

1031596  6/1966  United Kingdom .

OTHER PUBLICATIONS

Tiefenthaler, "Digital modulation using the Hilbert transform", Electronic Engineering, Apr. 1987, pp. 71-80.

Primary Examiner—David Mis
Attorney, Agent, or Firm—Spencer, Frank & Schneider

[57] ABSTRACT

In a vestigial sideband modulator, an i.f. signal is modulated with a video input and the extreme part of one of the sidebands is removed to provide the right frequency response shape for transmission. The signal for transmission is usually produced by mixing the i.f. signal with an oscillator signal known as the heterodyne signal which differs from the desired carrier frequency by the i.f. frequency, and filtering the signal with a subsequent channel filter to remove any unwanted heterodyne oscillator components and the unwanted sum or difference product. To avoid the need for such a channel filter, the filtered video-modulated i.f. signal is demodulated to quadrature baseband components using the i.f. oscillator, and quadrature components at carrier frequency are modulated with these baseband components to produce on combination a v.s.b. modulated video output at carrier frequency.

4 Claims, 2 Drawing Sheets

VESTIGIAL SIDEBAND MODULATOR FOR A BASEBAND INPUT SIGNAL

BACKGROUND OF THE INVENTION

This invention relates to vestigial sideband (v.s.b.) modulators.

Vestigial sideband modulators are used in television transmitters for modulating a video signal onto an r.f. carrier so that the modulated carrier has a vestigial sideband.

A typical v.s.b. modulator is shown in simplified form in FIG. 1. An input baseband signal e.g. a video signal is mixed in mixer 1 with an intermediate frequency (i.f.) carrier wave signal produced in an oscillator 2 to produce an amplitude modulated double sideband signal. The upper part of the upper sideband is removed in v.s.b. filter 3 and the signal is mixed in mixer 4 with an r.f. signal produced in oscillator 5, the frequency of which differs from the desired r.f. transmission frequency by the i.f. frequency. The output of the mixer 4 is filtered by a bandpass channel filter 6 to remove the r.f. carrier and the upper sideband frequency $w_c + 2w_{i.f.}$.

If it is desired to transmit at a different frequency, both oscillator frequency 5 and the channel filter 6 must be changed. The latter presents a problem since the channel filter depends on both the carrier frequency and the i.f. frequency, and is a relatively expensive and specialist item to obtain.

SUMMARY OF THE INVENTION

The invention provides a vestigial sideband modulator comprising first modulating means for modulating a signal derived from an i.f. oscillator with a baseband input signal, vestigial sideband filtering means for filtering the modulated i.f. signal, means for demodulating the filtered modulated i.f. signal to produce baseband components substantially in quadrature using signals derived from the i.f. oscillator, second modulating means for modulating signals which are substantially in quadrature and are derived from a carrier oscillator with the baseband quadrature components, and means for combining the modulated carrier signals to produce a vestigial sideband modulated carrier signal.

By demodulating the modulated i.f. signals to baseband after v.s.b. filtering and using the resulting quadrature components to modulate the quadrature signals at the output carrier frequency, a v.s.b. modulated r.f. output carrier can be produced without the necessity for a channel filter.

A loop control may be provided to maintain signals in quadrature phase relation derived from the i.f. oscillator and used to produce the baseband components, in-phase and quadrature, with the i.f. carrier wave component of the filtered modulated i.f. signal. Advantage may be taken of the fact that the baseband component output that is produced using the quadrature demodulating signal (that is, the signal derived from the i.f. oscillator which is in quadrature phase relation with the i.f. carrier wave component of the filtered modulated i.f. signal) is zero over the part of the frequency spectrum of the v.s.b. filter output that is double side band. Any deviations from zero over this range may be used to shift the phase of the quadrature signals derived from the i.f. oscillator in such a direction as to reduce that baseband component output.

Audio and digitally modulated signals, e.g. nicam (near instantaneously expanded audio multiplex) signals, modulated onto appropriate subcarriers, may be combined with the demodulated baseband components before modulation onto the carrier signals. Alternatively, such signals could be combined with the input baseband signal. Although the latter will usually be a vision signal, the invention is applicable to any baseband signal.

The v.s.b. modulator may be used as a standby transmitter, since it can operate at any frequency to which the carrier oscillator is set, or as video test equipment.

BRIEF DESCRIPTION OF THE DRAWINGS

A vestigial sideband modulator of a television transmitter constructed in accordance with the invention will now be described, by way of example, with reference to FIGS. 2 and 3 of the accompanying drawings, in which.

DETAILED DESCRIPTION OF THE PREFERRED EMBODIMENTS

Figure 1:
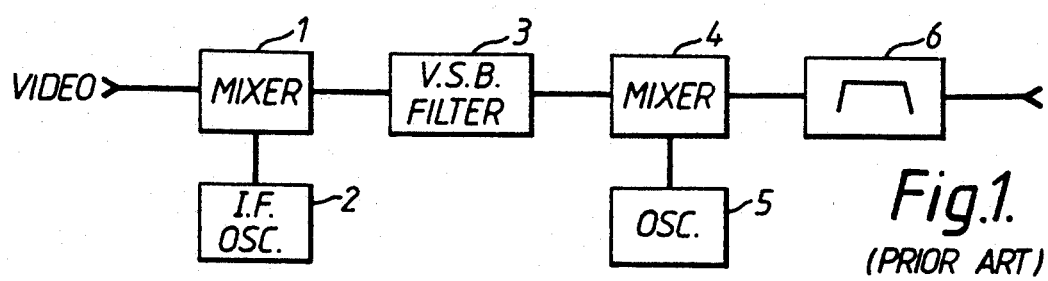
FIG. 1 is a typical prior art vestigial sideband modulator in simplified form.
Figure 3A:
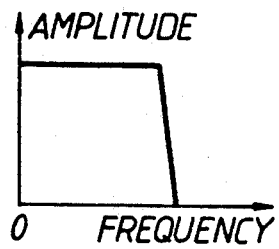
FIGS. 3a–3h shows the frequency response at various points in the modulator of FIG. 2.
Figure 3D:
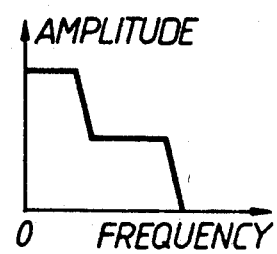
Figure 3B:
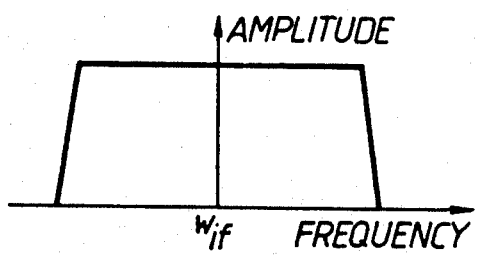

A composite video signal (the frequency response of which, typically extending to 5.5 MHz, is shown in FIG. 3a) forms the input to the modulator, and is fed to a first modulating means in the form of a mixer 7 which amplitude modulates the signal from a local i.f. oscillator 8 (typically 38.9 MHz) to produce double sideband amplitude modulation of the i.f. signal (FIG. 3b). The mixer 7 is followed by a vestigial sideband filter 9 which removes the upper part of the upper sideband (FIG. 3c), as in the prior art modulator. The v.s.b. filter may be a surface acoustic wave (SAW) filter. The mixer 7 in common with the other mixers in the circuit, could instead be implemented as multipliers.

Instead of changing the modulated i.f. signal to carrier frequency directly as in the prior art, the modulated i.f. signal is demodulated to baseband quadrature components in mixers 10, 11 by means of quadrature signals fed from a 90° splitter 12 which provides in-phase and quadrature components from the i.f. oscillator 8. The frequency bands at around twice the i.f. frequency are removed by low pass filters 13, 14.

Figure 3E:
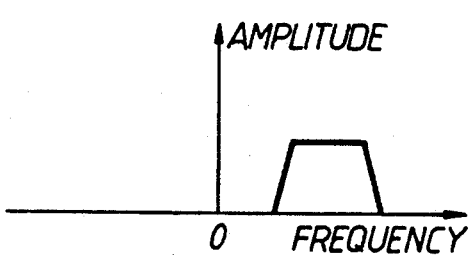
Figure 3C:
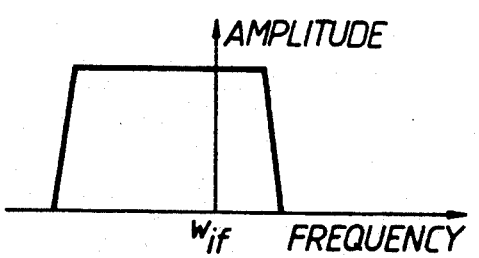

The frequency response of the baseband quadrature components is shown in FIGS. 3d and 3e. At low frequencies for which both sidebands are passed by the v.s.b. filter 9, the video modulated i.f. carrier may be represented by phasor diagram 3g, in which the carrier, cos $w_{i.f.}t$ is represented by a phasor of length unity and the video signal, a cos$w_v t$, by phasors of length $A/2$ which counter-rotate with angular velocity $w_v$. (The demodulated signal at the output of the mixers 10, 11 is of course represented just by video phasors on their own). It can be appreciated that mixer 10 fed by cos $w_{i.f.}t$ will (after filtering of the sum components in low pass filter 13) produce an output response at low video frequencies (since the video phasor has a resultant component parallel to the carrier phasor) but that the mixer 11 fed by sin $w_{i.f.}t$ (again, after filtering of the sum components in low pass filter 14) will not, since the video phasor never has any resultant component at right angles to the carrier phasor. The phasors representing the video signal always cancel in the sin $w_{i.f.}t$ direction which is at right angles to the carrier phasor.

Figure 3F:
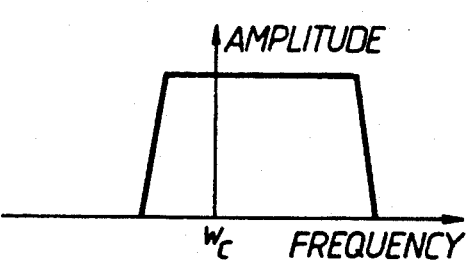
Figure 3G:
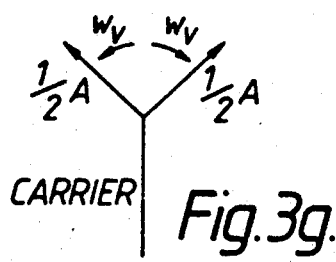
Figure 3H:
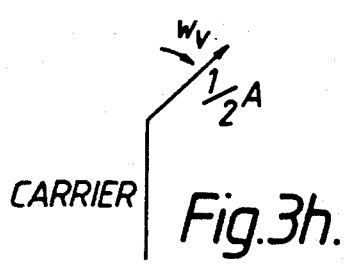

At higher video frequencies, when the operation is single sideband (s.s.b.) rather than double sideband (d.s.b.), the video modulated i.f. carrier has only one sideband hence is represented by FIG. 3h. It follows that the output of the mixer 10 is halved (FIG. 3d) at these frequencies, since the component of the video phasor in the direction of the carrier is halved, and there is a component of the same size in the sin $w_{i.f.}t$ direction (FIG. 3e).

In order to maintain the inputs to the demodulating mixers 10, 11 in phase and quadrature with respect to the i.f. oscillator 8, a phase shifter 26 is provided which varies the phase of the signal from the i.f. oscillator under the control of loop amplifier 27. The loop amplifier has a time constant such that it only responds to low frequency signals e.g. below a few hundred Hz. Since the output of the mixer (as explained above) should be zero at these frequencies, any response at these frequencies produces a voltage which causes the phase shifter 26 to vary the phase of the input to the splitter 12 in a direction that reduces that output.

When the demodulated baseband components are mixed at mixers 15, 16 with signals in quadrature from a local oscillator 17 at carrier frequency via 90° splitter 18, and combined at combiner 19, a v.s.b. modulated video output at carrier frequency $w_c$ is obtained (FIG. 3f).

Thus, if a tone in the video input may be represented by a $\cos w_v t$ and the signals produced by the local oscillators may be represented by $\cos w_{i.f.}t$ and $\cos w_c t$, the output of the mixer 7 at point b is given by $$A'[\cos(w_{i.f.}t - w_v t) + \cos(w_{i.f.}t + w_v t)]$$

After filtering, the lower frequency portion of the signal spectrum is double sideband and the upper frequency portion of the signal spectrum is single sideband. The respective components are at point c dsb $A''[\cos(w_{i.f.}t - w_v t) + \cos(w_{i.f.}t + w_v t)]$ ssb $A''[\cos(w_{i.f.}t - w_v t)]$ After demodulation to baseband quadrature components and low pass filtering, the components at points d, e are:

dsb $A'''$ [$\cos(w_v t)$] at point $d$ and 0 at point $e$ (the sin ($2w_{i.f.}t\ w_v t$) components having been filtered out)

ssb $\frac{A'''}{2}$ [$\cos(w_v t)$] at point $d$, and $\frac{A'''}{2}$ [$\sin(w_v t)$] at point $e$ When these are modulated onto quadrature carrier components, one obtains at point f dsb $A''''[\sin(w_c t - w_v t) + \sin(w_c t + w_v t)]$ ssb $A''''[\sin(w_c t + w_v t)]$ It will be noted that this corresponds to the desired signal since it is the same as appears at point c except that the signal is now at carrier frequency instead of i.f. frequency. There is a phase change of 90° which does not make any difference i.e. the expression uses sines not cosines, and there is a change of sign in the single sideband expression which represents the fact that the vestigial sideband is now lower rather than higher than the carrier frequency. In fact it would be possible for the v.s.b. filter 9 to attenuate the lower rather than the upper sideband, in which the case the same required output at point f could be produced by reversing the sine and cosine inputs at mixers 15 and 16.

It should be noted that acceptable results may be obtained if the splitters 12, 18 do not produce an exactly quadrature phase relationship between the outputs. Deviations from quadrature of one or two degrees, or even perhaps up to five degrees may be tolerated i.e. the output of the splitters 12, 18 must be substantially but not exactly in quadrature.

Audio and digital (e.g. nicam) signals are added to the vision signal by being combined at combiners 20, 21 from a 90° splitter 22 fed via combiner 25 from: an oscillator 24 (e.g. a VCO or numerically controlled oscillator) driven by an audio input 23 (providing audio frequency modulated onto a carrier operating at the desired difference between sound and vision typically 5.5 MHz): and a nicam input from an encoder (providing nicam stereo modulated onto a typically 6.552 MHz carrier). Alternatively, the audio and nicam signals could be combined with the vision signal in the baseband input. Such signals need not be combined with a vision signal at drive level, but could be transmitted separately to the vision signals.

The modulator of the invention possesses a number of advantages. Firstly, no channel filter is required since the carrier modulated video output is produced by directly modulating the carrier with video waveform components. It follows that the transmitting frequency can be changed simply by changing the carrier oscillator. Secondly, the long term stability of the i.f. oscillator does not affect the transmitted signal, since the i.f. signal is first modulated by the video signal and then the signal is demodulated to remove the i.f. signal.

The modulator may be used as a stand-by module for a television transmitter. Such a transmitter, at least in the U.K., will already have four modulators driving respective power amplifiers connected to the transmitting antenna. In the event of a modulator failing, the carrier oscillator 17 can be switched to the appropriate frequency and switched in to replace the defective one. Alternatively, a stand-by module could consist of a linear power amplifier and a modulator, which could be switched in to replace a defective module.

Alternatively, the module could form part of video test equipment in which the device under test requires to be fed with a v.s.b filtered vision r.f. signal at different r.f. carrier frequencies. All that needs to be done is to change the frequency of the carrier oscillator.

Figure 2:
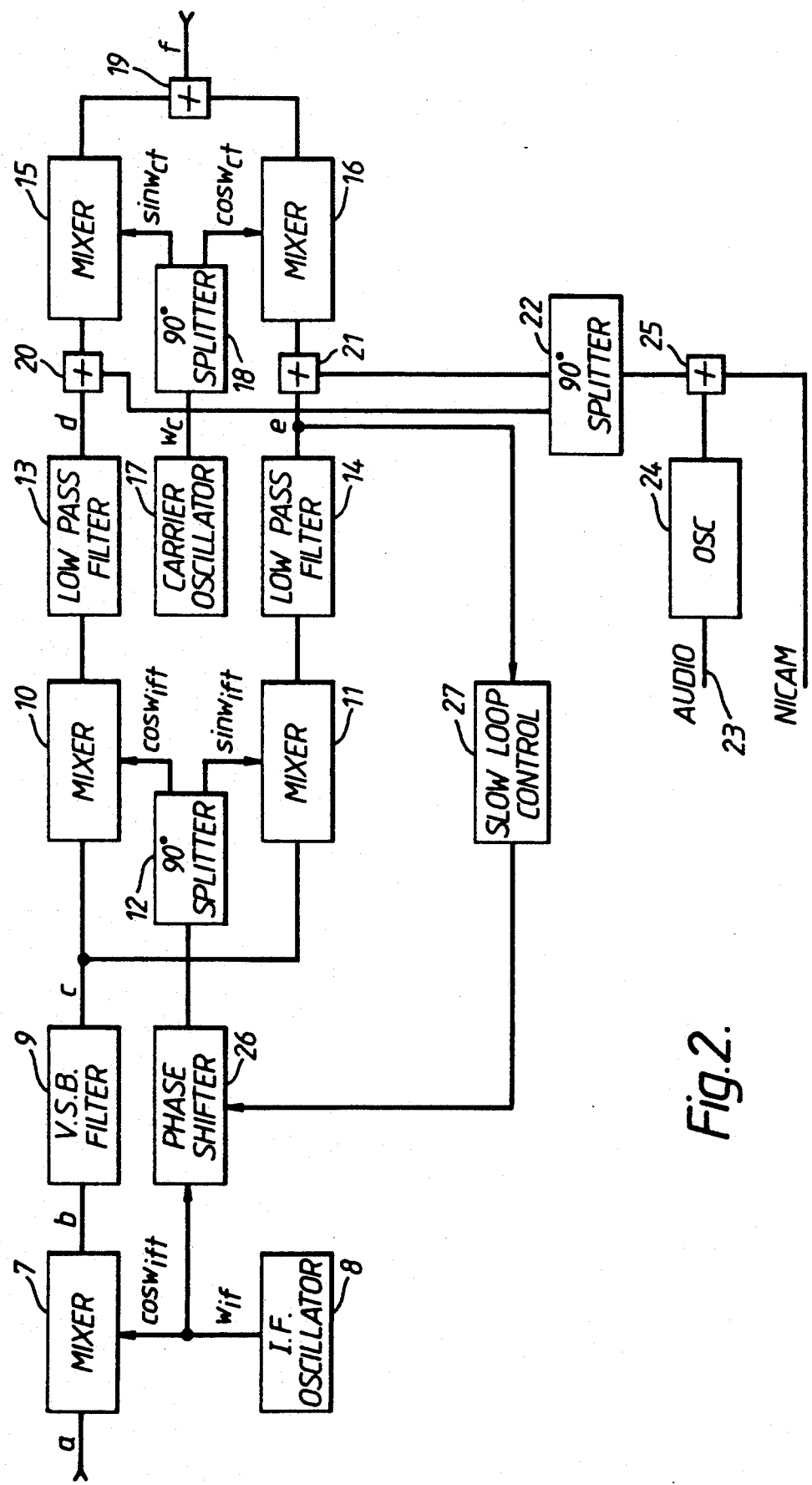
FIG. 2 is a block diagram of the v.s.b. modulator of this invention.

If desired, additional processing of the video modulated i.f. signal may be performed before demodulation, i.e. at point c in FIG. 2, e.g. precorrection to compensate for distortion in a klystron power amplifier.

The invention is not restricted to baseband video signals, but is applicable to other types of baseband input signal.

I claim:

1. A v.s.b modulator comprising first modulating means for modulating a signal derived from an i.f. oscillator with a baseband input signal, vestigial sideband filtering means for filtering the modulated i.f. signal, means for demodulating the filtered modulated i.f. signal to produce baseband components substantially in quadrature using signals derived from the i.f. oscillator, second modulating means for modulating signals which are substantially in quadrature and are derived from a carrier oscillator with the baseband quadrature components, and means for combining the modulated carrier signals to produce a vestigial sideband modulated carrier signal.

2. A v.s.b. modulator as claimed in claim 1, in which the demodulating means includes means for splitting the i.f. signal into substantially in-phase and quadrature components, and phase shifting means to adjust the phase of the i.f. signal fed to the splitting means to maintain one of the components in quadrature with respect to the phase of the i.f. component of the modulated i.f. signal.

3. A v.s.b. modulator as claimed in claim 2, in which the phase shifting means is arranged to adjust the phase so as to maintain zero output of low frequencies in the baseband component that is in quadrature with the i.f. component of the modulated i.f. signal.

4. A v.s.b. modulator as claimed in claim 1, including means for combining substantially quadrature components of a subcarrier frequency modulated by a subsidiary input with the baseband quadrature components for modulation of the quadrature signals derived from the carrier oscillator in the second modulating means.

* * * * *